United States Patent [19]

Shiraishi

[11] Patent Number: 5,420,417
[45] Date of Patent: May 30, 1995

[54] PROJECTION EXPOSURE APPARATUS WITH LIGHT DISTRIBUTION ADJUSTMENT

[75] Inventor: Naomasa Shiraishi, Kawasaki, Japan

[73] Assignee: Nikon Corporation, Tokyo, Japan

[21] Appl. No.: 305,746

[22] Filed: Sep. 14, 1994

Related U.S. Application Data

[63] Continuation of Ser. No. 177,188, Jan. 3, 1994, abandoned, which is a continuation of Ser. No. 953,888, Sep. 30, 1992, abandoned.

[30] Foreign Application Priority Data

Oct. 8, 1991 [JP] Japan .................................. 3-260765
Feb. 3, 1992 [JP] Japan .................................. 4-017524

[51] Int. Cl.$^6$ ............................................. G01J 1/32
[52] U.S. Cl. ............................... 250/205; 356/121
[58] Field of Search ............... 250/205; 356/121, 363; 359/19

[56] References Cited

U.S. PATENT DOCUMENTS

| | | | |
|---|---|---|---|
| 4,465,368 | 8/1984 | Matsuura et al. | 356/218 |
| 4,666,273 | 5/1987 | Shimizu et al. | 353/101 |
| 4,799,791 | 1/1989 | Echizen et al. | 356/121 |
| 4,947,413 | 8/1990 | Jewell et al. | 378/34 |
| 5,067,811 | 11/1991 | Ouchi | 356/121 |
| 5,184,196 | 2/1993 | Nakagawa et al. | 356/401 |

FOREIGN PATENT DOCUMENTS 0500393 8/1992 European Pat. Off. .
62-50811 4/1982 Japan .
61-41150 2/1986 Japan .

*Primary Examiner*—David C. Nelms
*Attorney, Agent, or Firm*—Shapiro and Shapiro

[57] ABSTRACT

A projection exposure apparatus provided with an illumination optical system for shaping the illuminating light from a light source into a substantially uniform intensity distribution and irradiating a mask bearing a periodical pattern with the uniform illuminating light, and a projection optical system for forming an image of the mask pattern onto a photosensitive substrate, comprise an optical member for forming plural secondary light source images respectively in discrete positions, eccentric from the optical axis of the illumination optical system or the projection optical system, on a plane in the vicinity of a Fourier transformation plane of the mask pattern or a plane conjugate therewith, in the optical path of the illumination optical system; a light amount varying device for individually regulating the light amounts of the illuminating light emerging from the plural secondary light source images; and a control device for controlling the light amount varying device, according to the direction of local periodicity of the mask pattern.

33 Claims, 10 Drawing Sheets

PROJECTION EXPOSURE APPARATUS WITH LIGHT DISTRIBUTION ADJUSTMENT

This is a continuation of application Ser. No. 08/177,188 filed Jan. 3, 1994, now abandoned, which is a continuation of application Ser. No. 07/953,888, filed Sep. 30, 1992, now abandoned.

BACKGROUND OF THE INVENTION

1. Field of the Invention

The present invention relates to a projection exposure apparatus used for the transfer of a circuit pattern of an integrated semiconductor device or the like, or of a pattern of a liquid crystal display device.

2. Related Background Art

For the formation of a circuit pattern of a semiconductor device or the like, there is generally employed a process called photolithography. This process usually employs a method of transferring a reticle (or mask) pattern onto a substrate such as a semiconductor wafer. Said substrate is coated with photosensitive photoresist, to which the circuit pattern is transferred according to an irradiating optical image, or the form of transparent portions of the reticle pattern. In a projection exposure apparatus, the circuit pattern which is formed on the reticle and is to be transferred, is focused on said substrate (wafer) through a projection optical system.

In an illuminating optical system, for illuminating the reticle, includes an optical integrator such as a fly's eye lens or optical fibers, thereby obtaining a uniform intensity distribution in the light illuminating the reticle. In order to attain optimum uniformity, in the use of a fly's eye lens, the focal plane of the fly's eye lens at the reticle side and the pattern bearing face of the reticle are substantially correlated by the relationship of a Fourier transformation, and the focal plane at the reticle side and the focal plane at the light source side are also correlated by a Fourier transformation. Consequently the pattern bearing face of the reticle and the focal plane of the fly's eye lens at the light source side (more precisely the focal planes of individual lenses of the fly's eye lens at the light source side) are in an imaging (conjugate) relationship. Therefore, the intensity on the reticle is averaged by the addition (superposition) of the illuminating lights from the individual elements (plural secondary light source images) of the fly's eye lens, so that the uniformity of illumination intensity on the reticle can be improved.

In the conventional projection exposure apparatus, the distribution of the illuminating light beam entering the entrance face of the optical integrator such as the above-mentioned fly's eye lens is made substantially uniform (but not completely uniform in practice) in a substantially circular (or rectangular) area around the optical axis of the illuminating optical system.

FIG. 1 schematically illustrates the configuration from the optical integrator to the wafer, in the above-mentioned conventional projection exposure apparatus. An illuminating light beam L130 illuminates a reticle pattern 17 of a reticle R, through a fly's eye lens 11, a spatial filter 12 and a condenser lens 15 in the illuminating optical system. Said spatial filter 12 is positioned at a reticle-side focal plane 11b of the fly's eye lens 11, namely the Fourier transformation plane (hereinafter called pupil plane) to the pattern bearing face of the reticle R, or in the vicinity thereof, and has a substantially circular (or rectangular) aperture around the optical axis AX of the projection optical system, thereby limiting the secondary light source (planar light source) image, formed on the pupil plane, in a circular (or rectangular) area. In this state, the ratio, or so-called $\sigma$ value, of the numerical aperture defined by the illuminating optical system 11, 12, 15 and the reticle-side numerical aperture of the projection optical system 18 is determined by the diaphragm aperture (for example the aperture of the spatial filter 12), and is generally in a range of 0.3 to 0.6.

The illuminating light beam L130 is diffracted by the pattern 17 formed on the reticle R, whereby the pattern 17 generates a 0-th order diffracted light $D_0$, a +1st-order diffracted light $D_p$ and a −1st-order diffracted light $D_m$, which are condensed by the projection optical system 18 and generate, on a wafer 20, complex interference fringes corresponding to the form of the pattern 17. Said interference fringes constitute the projected image of the pattern 17. In this state the angle $\theta$ (at the reticle side) between the 0-th order diffracted light $D_0$ and the ±1st order diffracted lights $D_p$, $D_m$ is defined by $\sin\theta = \lambda/P$, wherein $\lambda$ is the exposure wavelength and P is the pattern pitch. Solid lines representing the light beam L130 or the 0-th order diffracted light $D_0$ represent the principal ray emerging from a point on the fly's eye lens 11 or a point on the reticle pattern 17.

As the pattern pitch becomes finer (smaller), $\sin\theta$ becomes larger, and, when $\sin\theta$ exceeds the reticle-side numerial aperture ($NA_R$) of the projection optical system, the ±1st-order diffracted lights $D_p$, $D_m$ become unable to pass through said projection optical system. In such state the 0-th order diffracted light $D_0$ alone reaches the wafer W, so that the interference fringes are not generated. Thus, in case of $\sin\theta > NA_R$, the image of the pattern 17 cannot be obtained, so that the pattern 17 cannot be transferred onto the wafer W.

Based on these facts, there stands a relationship $\sin\theta = \lambda/P \approx NA_R$ in the conventional exposure apparatus, so that the pitch P is given by:

$$P \approx \lambda/NA_R \qquad (1)$$

In a 1:1 line-and-space pattern, the minimum pattern size (width), being equal to a half of the pitch P, is about $0.5 \cdot \lambda/NA_R$. In the practial lithography, however, a certain depth of focus is required because of wafer curvature, influence of steps on the wafer resulting from the process, or thickness of photoresist itself. Consequently, the practical minimum resolved pattern size can be represented as $k \cdot \lambda/NA$, wherein k is so-called process coefficient and is in a range of about 0.6 to 0.8. Since the ratio of the reticle-side numerical aperture $NA_R$ to the wafer-side numerical aperture $NA_W$ of the projection optical system is equal to the projection magnification of said system, the minimum resolved pattern size on the reticle is $k \cdot \lambda/NA_R$, and the minimum pattern size on the wafer is $k \cdot \lambda/NA_W = k \cdot \lambda/M \cdot NA_R$ wherein M is the projection magnification (reduction rate).

Therefore, for transferring a finer pattern, it has been necessary either to adopt an exposure light source emitting the light of a shorter wavelength, or to employ a projection optical system with a larger numerical aperture. It is naturally conceivable also to optimize both the wavelength and the numerical aperture. Also so-called phase shift reticle, for shifting the phase of the light transmitted through particular portions in the transparent areas of the reticle pattern, by $\pi$ with respect to that of the light transmitted through other portions, has been proposed for example in the Japanese Patent Publication No. 62-50811. Said phase shift reticle enables transfer of finer pattern than in the conventional art.

Also there has been proposed an inclined illumination method, based on the illumination of the reticle with light inclined by a predetermined angle. Said inclined illumination method is equivalent, in the basic principle, to a method for limiting the form of the secondary light source plane at a plane corresponding to the Fourier transformation of the reticle pattern or in the vicinity of said plane (hereinafter called "modified light source method"), reported at the Fall 1991 Convention of Applied Physics etc.

The present inventors already disclosed a unique system of the inclined illumination method, in the U.S. patent application Ser. No. 791,138, filed Nov. 13, 1991.

Also the idea of applying an inclined illumination method to the projection exposure apparatus was disclosed in the U.S. Pat. No. 4,947,413. The projection exposure apparatus disclosed therein improves the resolution by further providing a spatial filter, capable of transmitting the diffracted light of a selected order, at the Fourier transformation plane (pupil plane) in the projection optical system.

The invention disclosed in said U.S. Pat. No. 4,947,413 can be considered substantially same as the inclined illumination technology disclosed in the Japanese Patent Laid-open Application No. 61-41150, which was already publicly known at the filing of said U.S. Patent.

In the conventional exposure apparatus, however, it is presently difficult to adopt an illumination light source of a wavelength shorter than the present one (for example less than 200 nm), for example because of absence of the optical material suitable for use as a transmissive optical member.

Also the numerical aperture of the projection optical system is already close to the theoretical limit, and a further increase is hardly realizable. Even if a further increase in the numerical aperture is possible, the depth of focus represented by $\pm \lambda / 2NA^2$ decreases rapidly with the increase in numerical aperture, so that the practically needed depth of focus becomes less.

On the other hand, the phase shift reticle has a high cost because of complicated manufacturing process, and still involves various problems such as the unestablished methods for inspection and correction.

Furthermore the modified light source method is associated with the drawbacks of light amount loss or deteriorated uniformity in the illumination intensity, because the form of the secondary light source is limited by a shield plate (spatial filter) with a predetermined aperture, positioned at the plane corresponding to the Fourier transformation of the pattern bearing face of the reticle or in the vicinity thereof (particularly at the exit end of the fly's eye lens).

SUMMARY OF THE INVENTION

In consideration of the foregoing, an object of the present invention is to provide a projection exposure apparatus capable of providing a high resolving power and a large depth of focus, without light amount loss or deterioration in the illumination uniformity, even in the use of an ordinary reticle.

Another object of the present invention is, in a projection exposure apparatus utilizing the inclined illumination method, to enable satisfactory measurement of the uniformity of illumination intensity, in each of illuminating lights of mutually different directions of inclination.

Still another object of the present invention is, in the application of the inclined illumination method, to orient the illuminating light from the light source, without loss in the light amount.

Still another object of the present invention is, in the inclined illumination method, to match the light amount distribution between the illuminating lights in the mutually different directions of inclination, or to set a predetermined relationship in said light amount distribution.

The projection exposure apparatus of the present invention is constructed, in principle, as shown in FIG. 2, wherein the components same as those in the conventional configuration are represented by same numbers. Referring to FIG. 2, fly's eye lenses 11A, 11B are provided in a position substantially constituting a Fourier transformation plane with respect to the circuit pattern 17 on the reticle R (namely a position conjugate with the pupil plane 19 of the projection optical system 18), and each of the fly's eye lenses 11A, 11B are divided into plural fly's eye lenses. Also a light shield plate 12 is provided at the light source side, in order to bring the illuminating light distribution on the reticle-side focal plane 11b of the fly's eye lenses 11A, 11B to substantially zero, except in the individual lens positions of said fly's eye lenses 11A, 11B. Consequently the illuminating light distribution on the reticle-side focal plane 11b of the fly's eye lenses 11A, 11B exists only corresponding to the fly's eye lenses 11A, 11B but becomes substantially zero in other positions.

Since the reticle-side focal plane 11b of the fly's eye lenses 11A, 11B substantially correspond to the Fourier transformation plane of the reticle pattern 17, the light amount distribution (coordinates of the light beams) on said focal plane corresponds to the incident angle $\psi$ of the illuminating light beam to the reticle pattern 17. Consequently, the incident angle of the illuminating light beam to the reticle pattern 17 can be determined by regulating the individual positions (positions in a plane perpendicular to the optical axis) of the fly's eye lenses 11A, 11B. The fly's eye lenses 11A, 11B are preferably positioned in symmetric manner to the optical axis AX.

In the exposure apparatus of the above-explained configuration, there are provided light-absorbing filters (10a–10d) for regulating the intensities of the light beams emerging from the fly's eye lenses 11A, 11B, and a controller for obtaining a desired light intensity ratio corresponding to the direction of local periodicity of the reticle pattern.

Also provided is an illumination intensity detector (21) for measuring the intensities of the light beams from the fly's eye lenses 11A, 11B and the above-mentioned light absorbing filters are controlled according to the light intensity signals from said illumination intensity detector (21), namely the intensities of the light beams emerging from the fly's eye lenses.

Also according to the present invention, it is possible to render said fly's eye lenses 11A, 11B movable, independently and in a plane perpendicular to the optical axis, and to arbitrarily control the incident angles of plural illuminating light beams entering the reticle R, by displacing and regulating the positions of the individual fly's eye lenses.

Also according to the present invention, there are provided a light beam dividing member instead of shielding plate 12, for entering the illuminating light from the light source into each of fly's eye lenses 11A, 11B positioned in discrete areas separate from the optical axis AX in the Fourier transformation plane, and a light intensity varying member for regulating the intensity (light amount) of each of plural light beams emerging from said light beam dividing member. In this manner the fly's eye lenses receive the illuminating light in efficient manner (with matched intensities).

In the following there will be explained the effects attained by the above-explained basic configuration.

The circuit pattern 17 formed on the reticle (mask) generally contains a large amount of periodical patterns. Consequently the reticle pattern 17, irradiated by the illuminating light from a fly's eye lens 11A generates a 0-th order diffracted component $D_0$, ±1st-order diffracted components $D_p$, $D_m$ and higher order diffracted components, respectively in the directions of diffraction angles corresponding to the pitch of the pattern. Since the illuminating light beam L120 (principal ray only being illustrated in FIG. 2) enters the reticle R with an inclined angle $\psi$ with respect to the optical axis, the diffracted light components of respective orders generated from the reticle pattern 17 are also inclined with angular aberrations in comparison with the case of perpendicular illumination.

Thus the illuminating light L120 is diffracted by the reticle pattern 17, which generates a 0-th order diffracted light $D_0$ proceeding in a direction inclined by $\psi$ from the optical axis AX, a +1st-order diffracted light $D_p$ inclined by $\theta_p$ to the 0-th order diffracted light $D_0$, and a −1st-order diffracted light $D_m$ inclined $\theta_m$ to the 0-th order diffracted light $D_0$. Consequently the +1st-order diffracted light $D_p$ proceeds in a direction of an angle $(\theta_p+\psi)$ to the optical axis AX, and the −1st-order diffracted light $D_m$ proceeds in a direction of an angle $(\theta_m-\psi)$ to the optical axis AX.

The diffraction angles $\theta_p$, $\theta_m$ can be represented as:

$$\sin(\theta_p+\psi)-\sin\psi=\lambda/P \quad (2)$$

$$\sin(\theta_m-\psi)-\sin\psi=\lambda/P \quad (3)$$

With the increase of the diffraction angles $\theta_p$, $\theta_m$ by the reduction in size of the reticle pattern 17, at first the +1st-order diffracted light $D_p$, proceeding in the direction $(\theta_p+\psi)$ becomes unable to transmit the pupil 19 of the projection optical system 18, because of the relation $\sin(\theta_p+\psi)>NA_R$. However, because the illuminating light L120 is inclined to the optical axis AX, the −1st-order diffracted light $D_m$ can still enter the projection optical system even under an increased diffraction angle. Stated differently, there still stands a relation $\sin(\theta_m-\psi)<NA_R$. Consequently, on the wafer W, the 0-th order diffracted light $D_0$ and the −1st-order diffracted light $D_m$ form interference fringes, which constitute the image of the reticle pattern 17. In case the reticle pattern 17 consists of a 1:1 line-and-space pattern, it can be transferred with a contrast of about 90% onto the photoresist coated on the wafer W.

In this case the limit resolution is reached when a condition $$\sin(\theta_m-\psi)=NA_R \quad (4)$$

stands, so that the minimum transferable pattern pitch P on the reticle is:

$$NA_R+\sin\psi=\lambda/P$$

$$P=\lambda/(NA_R+\sin\psi) \quad (5)$$

For example, if $\sin\psi$ is selected at about $0.5\times NA_R$, the minimum transferable pitch of the reticle pattern is:

$$\begin{aligned} P &= \lambda(NA_R + 0.5NA_R) \\ &= 2\lambda/3NA_R \end{aligned} \quad (6)$$

On the other hand, in the conventional exposure apparatus in which the distribution of the illuminating light on the pupil plane of the reticle is circular around the optical axis AX of the projection optical system as shown in FIG. 1, the resolution limit is $P\approx\lambda/NA_R$ as indicated by the equation (1). From these facts it will be understood that a higher resolving power than in the conventional apparatus can be attained.

In the following there will be explained why a larger depth of focus can be obtained in the method of irradiating the reticle pattern with light beams of specific incident directions and angles and focusing the image pattern on the wafer by means of the 0-th and 1st order diffracted light components.

When the wafer W coincides with the focus position (best focal plane) of the projection optical system 18 as shown in FIG. 2, the diffracted lights emerging from a point of the reticle pattern 17 and reaching a point of the wafer W have a same optical path length, regardless of the passing position in the projection optical system 18. Consequently, even when the 0-th order diffracted light passes through the approximate center (vicinity of the optical axis) of the pupil plane 19 of the projection optical system 18 as in the conventional configuration, the 0-th order diffracted component and other diffracted components have a same optical path length, and the mutual wave front aberration is also zero.

However, in the defocus state in which the wafer W does not coincide with the focal position (best focusing plane) of the projection optical system 18, in the conventional configuration as shown in FIG. 1, the optical path length of the higher order diffracted lights, obliquely entering the projection optical system, is shorter than that of the 0-th order diffracted light passing the vicinity of the optical axis, in front of the focal point (farther from the projection optical system) but is longer behind the focal point (closer to the projection optical system), with a difference corresponding to the difference in the incident angle. Consequently the different diffracted lights mutually form a wave front aberration, thus generating defocus in front of and behind the focal position.

The above-mentioned wave front aberration caused by the defocus is given by $\Delta F \cdot r^2/2$, wherein $\Delta F$ is the amount of defocus of the wafer W from the focal position, and r is $\sin\theta$ of the incident angle $\theta_w$ of each diffracted light entering the wafer ($r=\sin\theta_w$). Thus, r represents the distance of each diffracted light from the optical axis AX on the pupil plane 19. In the conventional projection exposure apparatus shown in FIG. 1, $r=0$ stands for the 0-th order diffracted light because it passes a position close to the optical axis AX, and, for the ±1st-order diffracted lights $D_p$, $D_m$, $r = M \cdot \lambda/P$ wherein M is the image magnification ratio of the projection optical system.

Consequently the wave front aberration resulting from the defocus between the 0-th order diffracted light $D_0$ and the ±1st-order diffracted lights $D_p$, $D_m$ is $\Delta F \cdot M^2 (\lambda/P)^2/2$.

On the other hand, in the projection exposure apparatus of the present invention, the 0-th order diffracted light component $D_0$ is generated in a direction inclined by an angle $\psi$ from the optical axis AX, so that the distance of said component from the optical axis AX on the pupil plane 19 is represented by $r = M \cdot \sin\psi$. Also said distance for the −1st-order diffracted component is represented by $r = M \cdot \sin(\theta_m - \psi)$. If $\sin\psi = \sin(\theta_m - \psi)$ in this state, the relative wave front aberration, resulting from the defocus of the 0-th order diffracted component $D_0$ and the −1st-order diffracted component $D_m$, becomes zero, so that the image blur of the pattern 17 does not become as large as in the conventional configuration, when the wafer W is somewhat displaced in the axial direction from the focus position. Thus the depth of focus is increased. Since $\sin(\theta_m - \psi) + \sin\psi = \lambda/P$ as indicated by the equation (3), an increase in the depth of focus is possible if the incident angle $\psi$ of the illuminating light beam L120 is in a relationship $\sin\psi = \lambda/2P$ to the pattern pitch P.

In FIG. 2, two fly's eye lenses are positioned symmetrically to the optical axis AX, but the light amounts emerging from said fly's eye lenses 11A, 11B are not necessarily equal. Said light amounts have to be made mutually equal, in order to achieve symmetry in consideration of the positions of the fly's eye lenses and the amounts of light from said positions. Without said symmetry, the directional center of gravity of the illuminating light beams at the wafer conjugate plane (sum of the position vectors of the light beams from the optical axis, resppctively multiplied by the light amounts of said light beams, on the pupil plane of the projection optical system) becomes aberrated from the optical axis. Thus the telecentricity of the projection optical path is no longer maintained at the wafer side, thus resulting in a lateral displacement of the image of the pattern (so-called telecentricity displacement) in the out-of-focus state.

According to the present invention, the light beam intensity (light amount) from each fly's eye lens can be regulated by a light absorbing filter for regulating the light intensity from the fly's eye lens or a member for varying the incident light amount to said fly's eye lens.

Also there is provided an illumination intensity detector for measuring the intensity of the light beam from each fly's eye lens, thereby regulating the intensity ratio of the light beams at a predetermined value corresponding to the direction of local periodicity on the reticle pattern.

DESCRIPTION OF THE PREFERRED EMBODIMENTS

Figure 3:
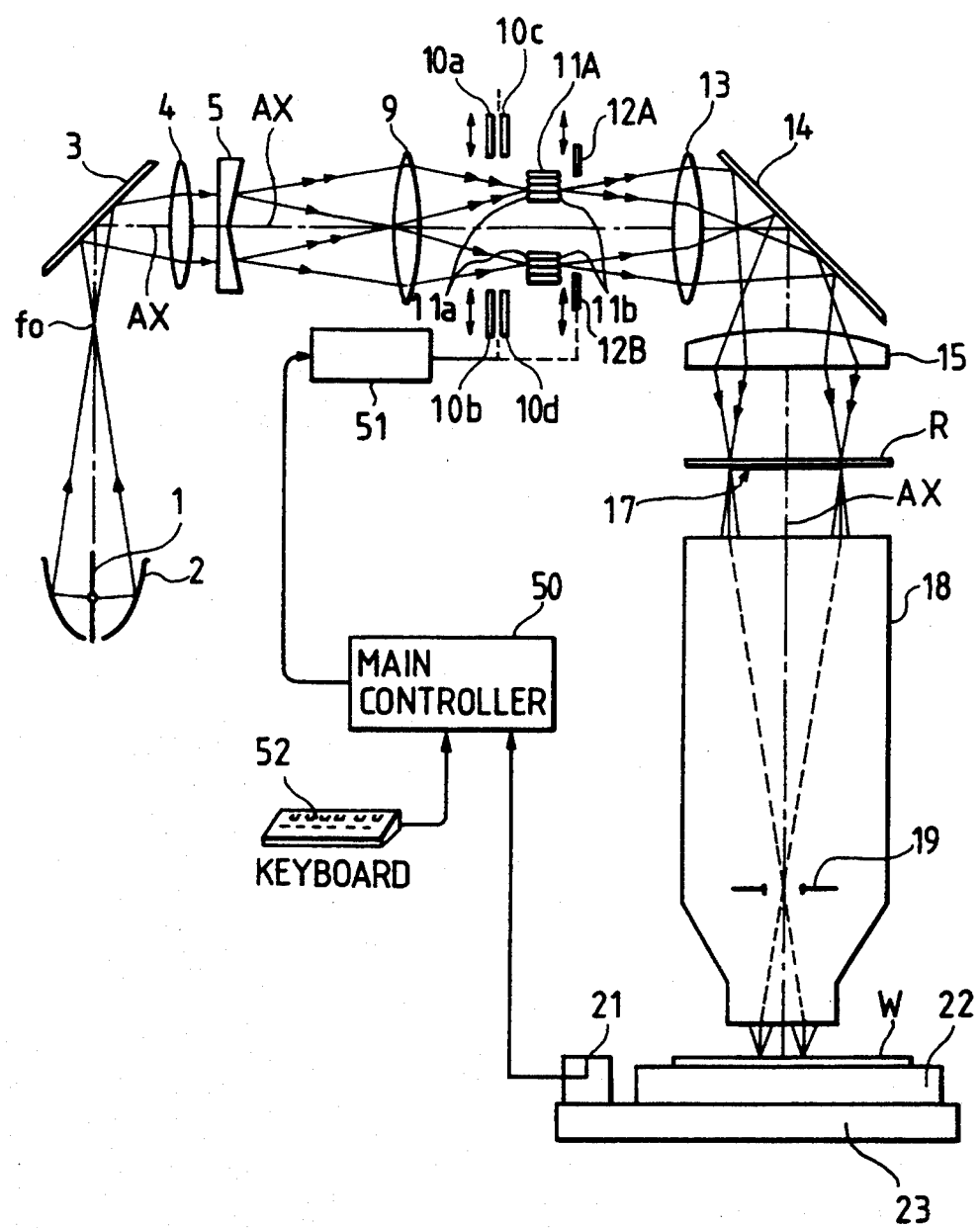
FIG. 3 is a schematic view showing the configuration of a projection exposure apparatus embodying the present invention.

FIG. 3 is a schematic view, showing the configuration of a projection exposure apparatus (stepper) embodying the present invention. In said configuration, in order to concentrate the light amount distribution of the illuminating light in predetermined areas of the light source-side focal plane 11a of the fly's eye lenses 11A, 11B, there is provided a polygonal prism 5, which constitutes a part of an input optical system or a light beam splitting member of the present invention.

An illuminating light beam, generated by a mercury lamp 1, is converged at a second focal point $f_0$ of an elliptical mirror 2, and illuminates the polygonal prism 5 by way of a mirror 3 and a relay lens system (or collimation lens) 4. Said illumination may be employed on Kehler illumination method or critical illumination method. Light beams generated by the polygonal prism 5 are respectively concentrated to fly's eye lenses 11A, 11B. The focal plane 11a at the light source side of the fly's eye lenses 11A, 11B and the polygonal prism 5 substantially satisfy the Fourier transformation relation through a relay lens 9. Though the illuminating light to the polygonal prism 5 is illustrated as a parallel light beam in FIG. 3, it is in fact a diverging light beam, so that the incident light beams to the fly's eye lenses 11A, 11B have certain sizes (areas).

On the other hand, the reticle-side focal plane 11b of the fly's eye lenses 11A, 11B is so positioned, in a plane perpendicular to the optical axis AX, as to substantially coincide with the Fourier transformation plane (pupil conjugate plane) of the reticle pattern 17. Each of the fly's eye lenses 11A, 11B is independently movable along the plane perpendicular to the optical axis AX, and is supported by a movable member for this purpose, as will be explained later.

The fly's eye lenses 11A, 11B are preferably of a same shape and a same material (refractive index).

Each of lens elements constituting each fly's eye lens 11A or 11B in FIG. 3 is formed as a biconvex lens in which the light source-side focal plane 11a and the reticle-side focal plane 11b respectively coincide with the entrance plane and the exit plane, but each lens element is not required to strictly satisfy these conditions, and may be formed as a planoconvex, convexplano or planoconcave lens.

The light source-side focal plane 11a and the reticle-side focal plane 11b of the fly's eye lens are naturally in the Fourier transformation relation. Consequently, in the configuration shown in FIG. 3, the reticle-side focal plane 11b, or the exit face, of the fly's eye lenses 11A, 11B is in the imaging (conjugate) relationship with the polygonal prism 5.

Figure 4:
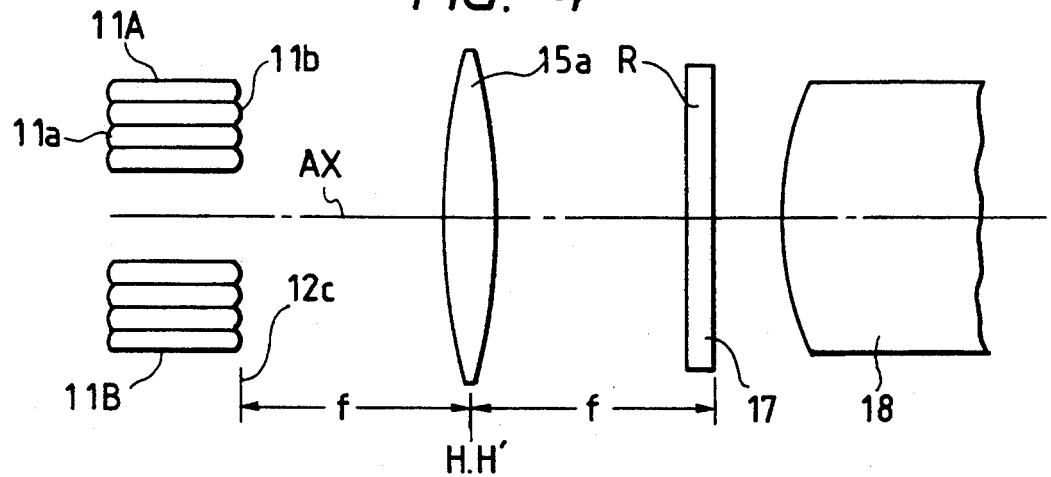
FIG. 4 is a schematic view showing the configuration from fly's eye lenses to a projection optical system in the projection exposure apparatus embodying the present invention.

FIG. 4 is a schematic view of the configuration from the fly's eye lenses 11A, 11B to the projection optical system 18 in the projection exposure apparatus, wherein the reticle-side focal plane 11b of the fly's eye lenses coincides with the Fourier transformation plane 12c of the reticle pattern 17. Also the optical system providing the Fourier transformation relation between the reticle-side focal plane 11b and the reticle pattern 17 is represented by a single lens 15a (in fact it is composed of condenser lenses 13, 15 shown in FIG. 3). It is also assumed that the distance from the principal point H of the lens 15a at the side of the fly's eye lenses to the reticle-side focal plane 11b of the fly's eye lenses 11A, 11B, and the distance from the principal point H' of the lens 15a at the reticle side to the reticle pattern 17, are both equal to f.

The light beams emerging from the reticle-side focal plane 11b of the fly's eye lenses 11A, 11B illuminate the reticle R with uniform intensity distribution, through condenser lenses 13, 15 and a mirror 14 shown in FIG. 3. Light shield plates (shutter) 12A, 12B are provided respectively corresponding to the fly's eye lenses 11A, 11B and are rendered independently movable, whereby the illuminating light beams from the fly's eye lenses 11A, 11B can be arbitrarily shielded or transmitted. Consequently the reticle pattern 17 can be illuminated only by the light beam (light beam from the secondary light source image) coming from either of the fly's eye lenses 11A, 11B. Therefore, in the measurement of light beam intensity with the illumination intensity detector 21 of which light-receiving face is substantially conjugate with the surface of the wafer W, the light beam intensity from each fly's eye lens can be independently measured. Said illumination intensity detector 21 need not necessarily be positioned at the side of the wafer W, but may be formed by providing the mirror 14 with a transmittance of several per cent, also providing a lens system for forming, at the rear side of said mirror 14, a plane conjugate with the focal plane 11b and placing sensors on said conjugate plane. In such case the light shield plates 12A, 12B may be dispensed with because of each output plane of fly's eye lenses 11A, 11B is imaged individually on said sensors respectively.

Figure 1:
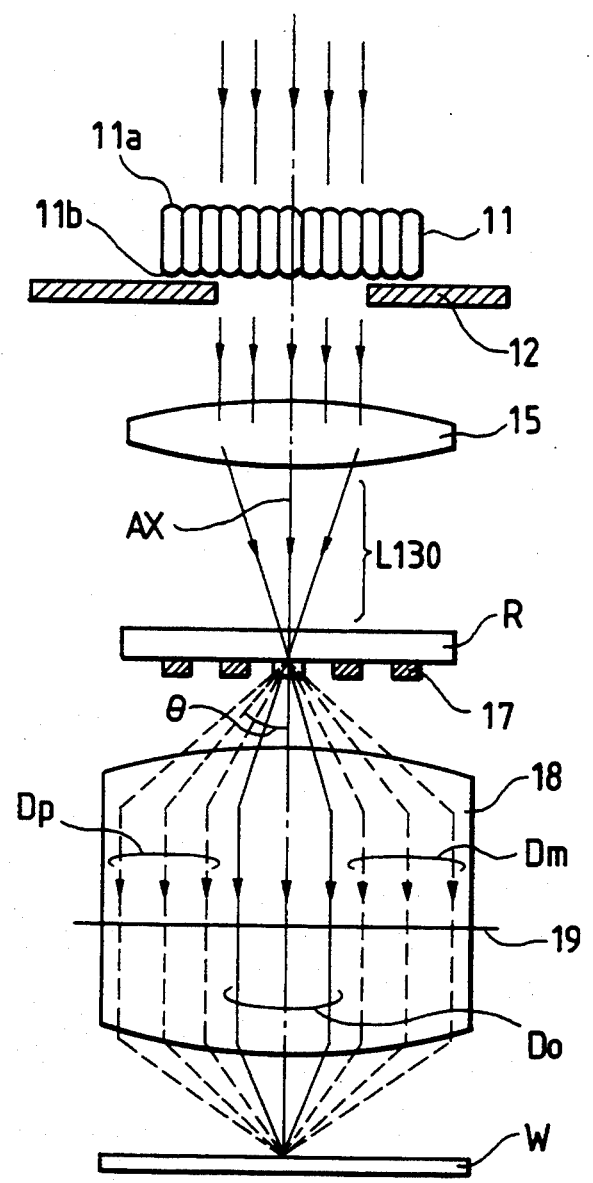
FIG. 1 is a schematic view showing the configuration of a conventional projection exposure apparatus.
Figure 2:
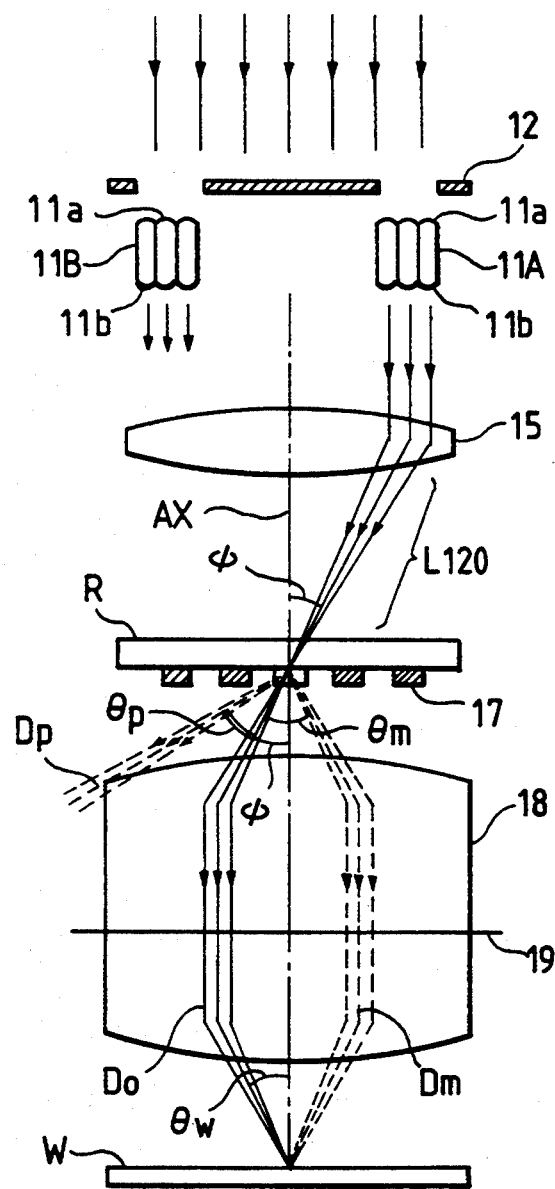
FIG. 2 is a schematic view showing the principle of the present invention.

The diffracted lights, generated from the reticle pattern 17 of the reticle R illuminated as explained above, are focused by the telecentric projection optical system in the same manner as explained in relation to FIG. 2, thus transferring the image of the reticle pattern 17 onto the wafer W.

In dividing the illuminating light beam and concentrating the divided beams to specified positions in the light source-side focal plane of the fly's eye lenses 11A, 11B, the concentrated positions vary according to the inclination angle and the direction of the polygonal prism 5. Thus, said inclination angle and direction of said prism 5 are determined so as to concentrate the illuminating light beams to the fly's eye lenses 15A, 15B.

In the above-explained embodiment, a Fourier transformation relation is maintained between the polygonal prism 5 and the fly's eye lenses 11A, 11B, but there may also be employed an imaging relation instead. However, the Fourier transformation relation is preferable, because it can prevent deterioration of illumination uniformity on the reticle R, resulting for example from dusts on the polygonal prism 5.

Also the illustrated polygonal prism 5 is designed to split the illuminating light beam into two beams, but the number of faces of said prism may be increased to four in pyramidal arrangement for splitting into four beams, or may be increased further for obtaining a larger number of beams. Also the polygonal prism may be replaced by a diffraction grating pattern for generating diffracted lights in plural directions.

Again referring to FIG. 3, at the light source side of the fly's eye lenses 11A, 11B, light absorbing filters (or meshes) 10a, 10b, 10c, 10d are provided, independently insertable into the optical paths of the fly's eye lenses, as the light intensity varying means. The two filters 10a, 10c provided at the light source side of the fly's eye lens 11A have mutually different transmittances. For example if the filters 10a, 10c respectively have transmittances of 99% and 98%, combinations of these two filters realize four different transmittances of 100% (neither filter used), 99% (filter 10a alone used), 98% (filter 10c alone used), and 97% (both filters used). Same applies to the filters 10b, 10d at the light source side of the fly's eye lens 11B. The insertion and retraction of the filters 10a–10d are controlled by a driving system 51, which also controls the insertion and retraction of the light shield plates 12A, 12B in the vicinity of the exit faces of the fly's eye lenses. It also effects the movement of the fly's eye lenses if they are movable.

In FIG. 3, a wafer holder 22, supporting the wafer W, is movable along a plane perpendicular to the optical axis AX, by means of a wafer stage 23. On said wafer stage 23 there is provided an illumination intensity detector 21, which can measure the illuminating light intensity in a position substantially same as the image plane on the wafer. It is therefore possible to measure the light beam intensity, or the illumination intensity distribution, from each of the fly's eye lenses 11A, 11B by intercepting the illuminating light beam from the other by manipulating the light shield plates 12A, 12B. Said measurement is preferably conducted in the absence of the reticle R, but may be conducted in the presence thereof. According to the measured beam intensities, the filters 10A–10D are operated so as to attenuate the particularly strong beam. In this manner the light beams from the fly's eye lenses can be made same in the intensity. Also the fly's eye lenses are positioned symmetrically with respect to the optical axis AX. Consequently the directional center of gravity, or the sum of the positional vectors of the light beams with respect to the optical axis AX on the pupil plane 19 of the projection optical system 18, respectively multiplied by the light amounts, becomes zero, so that the aforementioned telecentricity displacement can be avoided. It is also possible, as will be explained later, to arbitrarily select the intensity ratio of the light beams from the fly's eye lenses according to the directionality of the pattern of the reticle (for example according to the ratio of patterns extending in different directions). If used only for measuring the light amount emitted from a fly's eye lens, the light receiving surface of the illumination intensity detector 21 is preferably selected same size as the projection image field of the projection optical system 18.

The above-mentioned light absorbing filters 10a-10d may be inserted in the light beams emerging from the fly's eye lenses 11A, 11B, but they are preferably provided at the light source side of the fly's eye lenses, in order not to deteriorate the uniformity of illuminating light, attained on the reticle (plane conjugate with the wafer) by the fly's eye lenses. In case the filters are positioned at the reticle side of the fly's eye lenses, a variable diaphragm is preferably provided in the vicinity of the reticle-side focal plane of each fly's eye lens. Said variable diaphragm is also controlled by a main control system 50 and a drive system 51.

The mercury lamp 1, used as the light source, is limited in the service life, and is currently replaced about every 600 hours for example.

The mercury lamp is associated with fluctuation in performance, resulting from the manufacturing stage, for example in the light amount distribution characteristics. For this reason, the light beam intensities from the fly's eye lense, if mutually equal for a lamp, may no longer be equal after lamp replacement. Also such change may also occur by the time-dependent alteration of the performance, even during the service life of a same mercury lamp. Consequently the above-mentioned filter adjustment is preferably conducted at each lamp replacement or at every 100 service hours of each lamp.

The position of the secondary light source image, in the reticle-side focal plane of the fly's eye lenses, is preferably variable according to the pitch (periodicity) of the reticle pattern to be used. In the following there will be explained an embodiment in which the fly's eye lenses are rendered movable.

Figure 5:
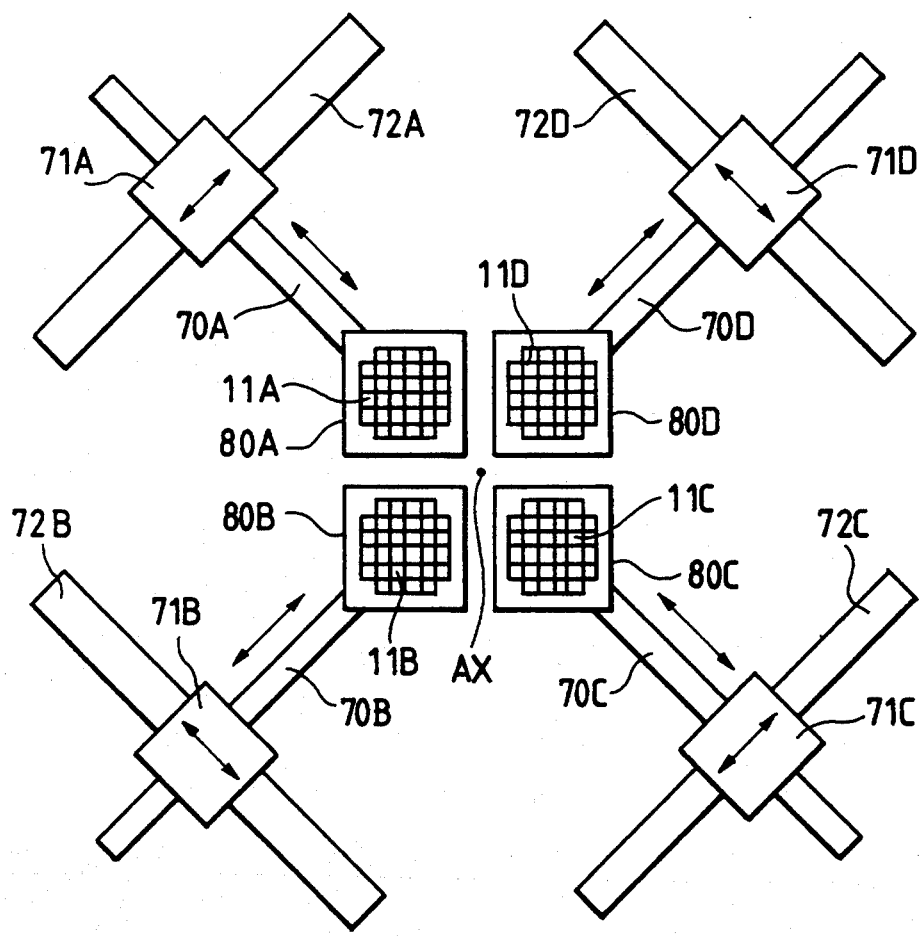
FIG. 5 is a view, seen from the axial direction, showing the arrangement of fly's eye lenses and moving members therefor in the projection exposure apparatus embodying the present invention.
Figure 6:
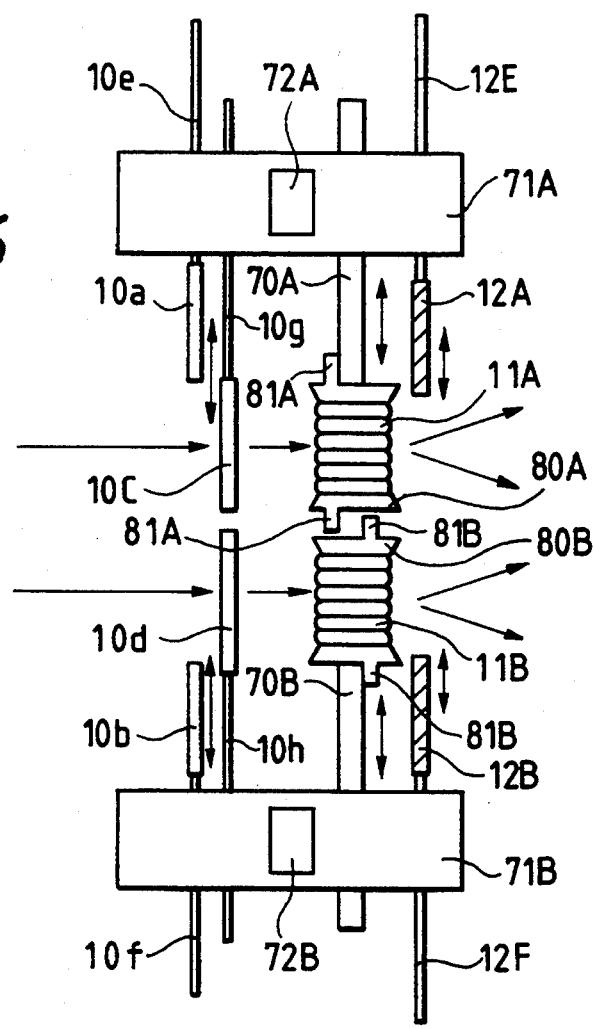
FIG. 6 is a view, seen from a direction perpendicular to the optical axis, showing the arrangement of fly's eye lenses and moving members therefor in the projection exposure apparatus embodying the present invention.

FIG. 5 is a view of moving parts for the fly's eye lenses, seen from the axial direction, and FIG. 6 is a view seen from a direction perpendicular to the optical axis. In FIG. 5, four fly's eye lenses 11A, 11B, 11C and 11D are provided at a substantially same distance from the optical axis. Each of said fly's eye lenses is composed of 32 lens elements, but this is not limitative. In an extreme case, each fly's eye lens may be composed of two lens elements.

In FIGS. 5 and 6, the fly's eye lenses 11A, 11B, 11C, 11D are respectively supported by jigs 80A, 80B, 80C, 80D which are in turn supported by movable members 71A, 71B, 71C, 71D respectively through supporting rods 70A, 70B, 70C, 70D. Said supporting rods 70A, 70B, 70C, 70D are respectively extendable and shrinkable in the radial directions with respect to the optical axis AX, by means of driving elements such as motors and gears provided in the movable members 71A, 71B, 71C, 71D. Also said movable members themselves are respectively movable along fixed guides 72A, 72B, 72C, 72D. Consequently each of the fly's eye lenses 11A, 11B, 11C, 11D is independently movable to an arbitrary position in a plane perpendicular to the optical axis AX.

Also as shown in FIG. 6, at the entrance side of the fly's eye lenses, there are provided light absorbing filters 10a, 10b, 10c, 10d which can be independently inserted into or retracted from the light beams by means of supporting rods 10e, 10f, 10g, 10h. In case the fly's eye lenses 11A, 11B are moved, the light absorbing filters 10a, 10b, 10c, 10d may be moved accordingly. Also the light shield plates 12A, 12B are movable according to the movement of the fly's eye lenses 11A, 11B, and are capable of transmitting the light beam from the arbitrary one of the fly's eye lenses and intercepting the light beam from the other, regardless of the position thereof. Also the jigs 80A, 80B supporting the fly's eye lenses 11A, 11B may be provided with light shielding blades 81A, 81B, whereby the aperture of the light shield plate 12 as shown in FIG. 2 may be made considerably larger than the diameter of the fly's eye lens. But, in the actual system, shield plate 12 may not be needed. Also said light shielding blades 81A, 81B may be slightly displaced in the axial direction, in order to reduce the limitation in the movable range of the fly's eye lenses.

Figure 7:
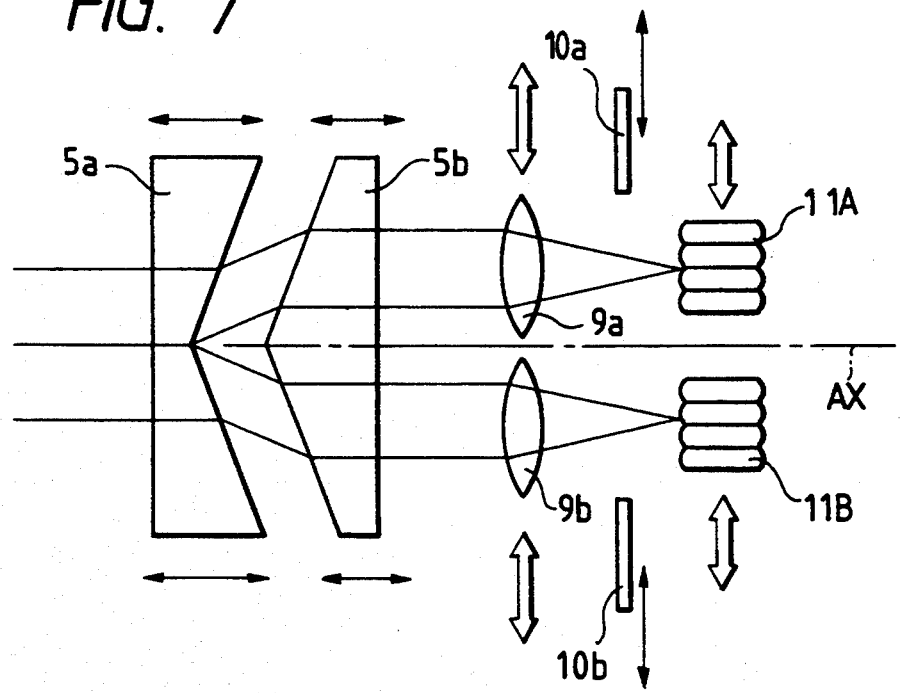
FIG. 7 is a view showing another configuration of an input optical system (light beam splitting system)

In case the fly's eye lenses 11A-11D are moved as explained above, the passing positions of the light beams emerging from the input optical system (light beam splitting member) such as the polygonal prism 5 have to be moved accordingly. FIG. 7 shows the configuration of the input optical system meeting this requirement.

The input optical system is composed of two polygonal prisms 5a, 5b, of which mutual distance may be varied for varying the distances of the split light beams from the optical axis. Also the circumferential positions of the light beams about the optical axis may be varied by rotating said prisms 5a, 5b about the optical axis AX. The configuration for varying the passing positions of the light beams is not limited to the above-explained system. For example, in case of using the above-explained diffraction grating pattern, it may be replaced by another pattern different in the pattern pitch and/or pattern direction. Also the relay lens 9 shown in FIG. 3 is replaced, in the configuration shown in FIG. 7, by individual relay lenses 9a, 9b, . . . respectively corresponding to the fly's eye lenses 11A-11D, and respectively movable with the fly's eye lenses 11A, 11B, . . .

Positions of the fly's eye lenses 11A-11D, in a plane perpendicular to the optical axis as shown in FIGS. 5 and 6, are to be determined according to the reticle pattern to be transferred. More specifically, according to the principle explained in relation to FIG. 2, the illuminating light beams from the fly's eye lenses are made to enter the reticle pattern with such an incident angle ψ as to provide an optimum resolution and an optimum improvement in the depth of focus for the pitch of the pattern to be transferred.

In the following, therefore, there will be given further explanation on the relation between the reticle pattern and the arrangement of the fly's eye lenses 11A-11D, with reference to FIG. 8.

Figure 8A:
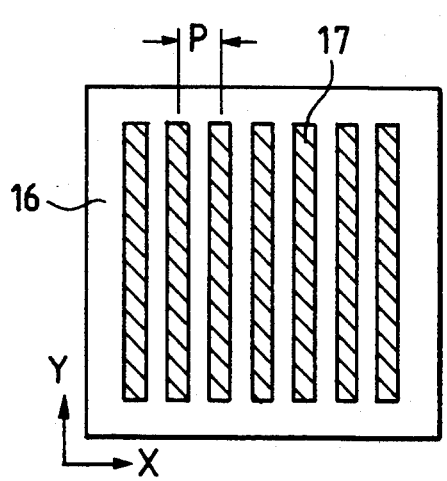
FIGS. 8A and 8C are views showing examples of reticle pattern formed on the mask.
Figure 8C:
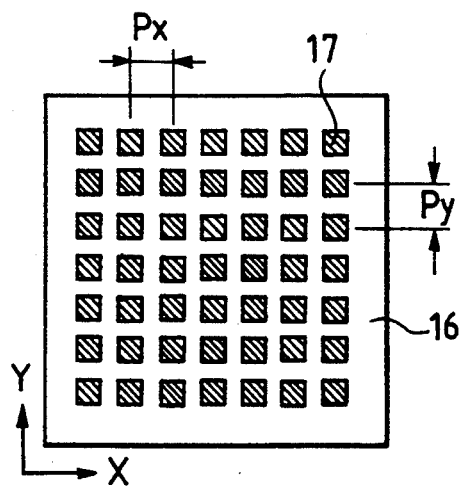
Figure 8B:
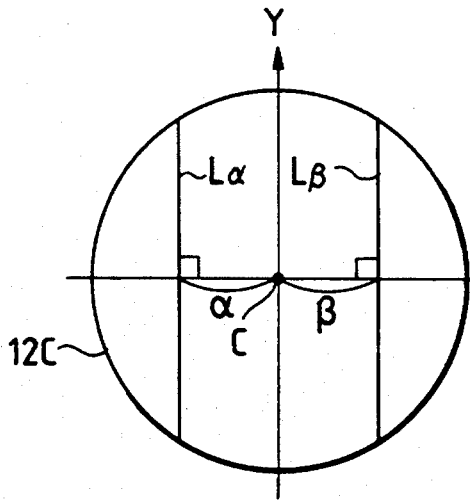
FIGS. 8B and 8D are views showing the positions of the fly's eye lenses on the Fourier transformation plane of the reticle pattern, optimum for illuminating the patterns shown in FIGS. 8A and 8C.
Figure 8D:
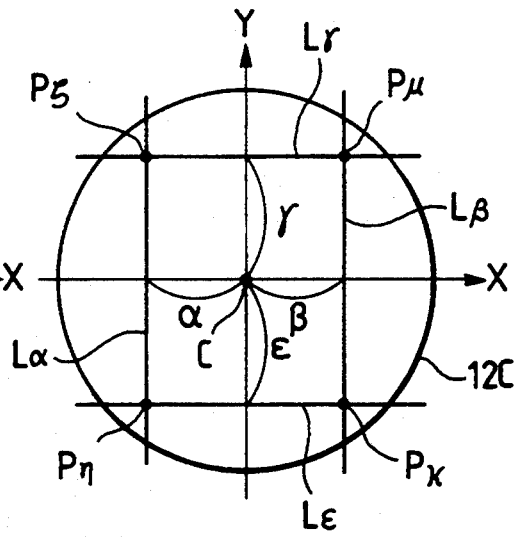

Specific examples of determination of positions of the fly's eye lenses are shown in FIGS. 8A to 8D. FIGS. 8A and 8C illustrate examples of the pattern formed on the reticle. FIG. 8B shows the center positions of the fly's eye lenses, on the Fourier transformation plane (or pupil plane 19 of the projection optical system) of the reticle pattern, optimum for illuminating the pattern shown in FIG. 8A, while FIG. 8D shows the center positions of the fly's eye lenses optimum for illuminating the pattern shown in FIG. 8C.

FIG. 8A shows so-called one-dimensional line-and-space pattern in which stripe-shaped transparent areas and opaque line areas, extending in the Y-direction and having a same width, are arranged in the X-direction with a pitch P. For such case, the optimum positions of the fly's eye lenses can be arbitrarily selected, as shown in FIG. 8B, on lines L$\alpha$ and L$\beta$ in the Y-direction on the Fourier transformation plane. FIG. 8B shows the Fourier transformation plane 12c of the reticle pattern 17 (or the reticle-side focal plane 11b of the fly's eye lenses), seen from the direction of the optical axis AX, and the coordinate system on said plane 12c is taken same as that of the reticle pattern, seen from the same direction, as shown in FIG. 8A. Referring to FIG. 8B, the distances $\alpha$, $\beta$ from the center C where the optical axis AX passes to the lines L$\alpha$, L$\beta$ are mutually equal and satisfy a relation $\alpha = \beta = f \cdot \lambda / 2P$ (f is focal length shown in FIG. 4). This relation can be rewritten as $\sin\psi = \lambda / 2P$ by representing said distances $\alpha$, $\beta$ as $f \cdot \sin\psi$, and coincides with the principle already explained in relation to FIG. 2. Consequently, if the centers of the fly's eye lenses (or the centers of gravity of light amount distributions of the secondary light source images respectively formed by the fly's eye lenses) are respectively on the lines L$\alpha$, L$\beta$, either one of the ±1st-order diffracted lights and the 0-th order diffracted light, generated from the line-and-space pattern as shown in FIG. 8A, illuminated by the light beams from the above-mentioned fly's eye lenses, pass through positions of a substantially same distance from the optical axis AX on the pupil plane 19 of the projection optical system. It is therefore possible, as explained before, to maximize the depth of focus and to obtain a high resolving power for the line-and-space pattern shown in FIG. 8A. Thus, in case the reticle pattern consists solely of the one-dimentional line-and-space pattern, there are required only two fly's eye lenses, respectively on the lines L$\alpha$ and L$\beta$.

FIG. 8C shows a reticle pattern consisting of a two-dimensional island pattern, with pitches Px and Py respectively in the X and Y directions. FIG. 8D shows the optimum positions of the fly's eye lenses, in the Fourier transformation plane 12c, for illuminating such pattern. The X, Y coordinate system are same in FIGS. 8A to 8D. When the illuminating light enters a two-dimensional pattern as shown in FIG. 8C, diffracted lights are generated in two-dimensional directions, according to the two-dimensional periodicity (Px in the X-direction and Py in the Y-direction) of the pattern. Also in this case, the depth of focus can be maximized by positioning either one of the ±1st-order diffracted lights and the 0-th order diffracted light at approximately equal distances from the optical axis AX on the pupil plane 19 of the projection optical system. More specifically, for the X-components in the pattern shown in FIG. 8C, the depth of focus can be maximized by positioning the centers of fly's eye lenses on lines L$\alpha$, L$\beta$ satisfying a condition $\alpha = \beta = f \cdot \lambda / 2Px$ as shown in FIG. 8D, wherein Px is the pattern pitch in the X direction. Similarly the depth of focus for the Y-components of the pattern can be maximized by positioning the centers of the fly's eye lenses on lines L$\gamma$, L$\epsilon$ satisfying a condition $\gamma = \epsilon = f \cdot \lambda / 2Py$.

Thus, when the illuminating light beams from the fly's eye lenses positioned as shown in FIG. 8B or 8D enter the reticle pattern, either the +1st-order diffracted light $D_p$ or −1st-order diffracted light $D_m$, and the 0th-order diffracted light $D_0$ pass positions of substantially same distances from the optical axis AX on the pupil plane 19 of the projection optical system 18. Thus there can be realized a projection exposure apparatus of a high resolving power and a large depth of focus.

In the foregoing there have been considered only two examples of the reticle pattern as shown in FIGS. 8A and 8C, but, also for other patterns, the centers of the fly's eye lenses may be so positioned, in consideration of the periodicity (fineness) of said pattern, that either one of the ±1st-order diffracted components and the 0th-order diffracted component from said pattern pass through positions of substantially same distances from the optical axis AX on the pupil plane 19 of the projection optical system.

In the patterns shown in FIG. 8A or 8C, the ±1st-order diffracted components become stronger among the various diffracted components, because the duty ratio between the opaque portions and the transparent portions is 1:1. For this reason there is only considered the relation between either of the ±1st-order diffracted lights and the 0th-order diffracted light. However, in a pattern of a duty ratio different from 1:1, there may be similarly considered the relation of another diffracted component, for example the relation of either one of the ±2nd-order diffracted lights and the 0th-order diffracted light.

Also in case the reticle pattern 17 contains two-dimensional periodicity as shown in FIG. 8C, and if a particular 0th-order diffracted light component is considered on the pupil plane 19 of the projection optical system, there can be present a 1st- or higher-order diffracted light component distributed in the X-direction and a 1st or higher-order diffracted light component distributed in the Y-direction, around said 0th-order component. Therefore, for achieving satisfactory imaging of two-dimensional pattern with respect to said particular 0th-order diffracted light, it is required to regulate the position of said 0th-order component (position of a fly's eye lens) in such a manner that one of the higher-order diffracted light compomcents distributed in the X-direction, one of the higher-order diffracted light components distributed in the Y-direction, and said 0th-order diffracted light component are positioned at substantially same distances from the optical axis AX on the pupil plane 19. As an example, the center position of the fly's eye lens is to be matched, in FIG. 8D, one of the points P$\zeta$, P$\eta$, P$\kappa$ and P$\mu$. These points represent optimum light source positions for the X- and Y-directions of pattern, as they are crossing points of the line L$\alpha$ or L$\beta$ (representing optimum positions for the periodicity in the X-direction, namely for positioning either one of the ±1st-order diffracted light and the 0th-order diffracted light at substantially same distances from the optical axis on the pupil plane 19) and the line L$\gamma$ or L$\epsilon$ (representing optimum positions for the periodicity in the Y-direction).

The foregoing embodiment has assumed a two-dimensional pattern including a pattern of two-dimensional directionality in a same position on the reticle, but the above-explained method is applicable also in case the reticle pattern includes plural patterns showing different directionality in different positions.

Also in case the reticle pattern contains plural directionalities or plural finenesses (pitch size), the optimum position of the fly's eye lens is determined according to each directionality and fineness of the pattern, as explained above. Otherwise the fly's eye lens may be placed at an average position of the optimum positions. Said average position may be a weighted average position, with a weight determined in consideration of the fineness or importance of the pattern. In case the fly's eye lenses are moved as explained above, it is desirable to measure the light beam intensity from each fly's eye lens by the illumination intensity detector 21 and to confirm that the desired light amounts are obtained.

In the foregoing embodiments, it is assumed that the reticle receives mutually equal light amounts from the plural fly's eye lenses, but a new effect can be attained by realizing different light beam intensities from the fly's eye lenses by the light intensity varying means of the present invention, as will be explained in the following.

Figure 9A:
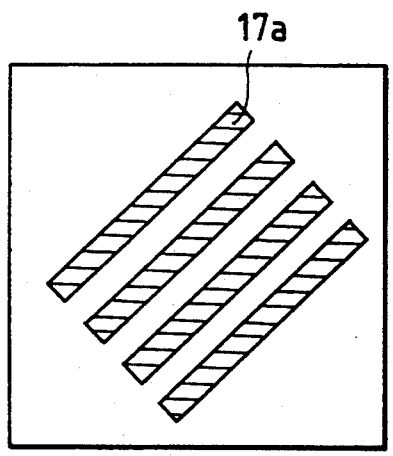
FIGS. 9A and 9C are views showing examples of reticle pattern to be employed in the projection exposure apparatus embodying the present invention.
Figure 9B:
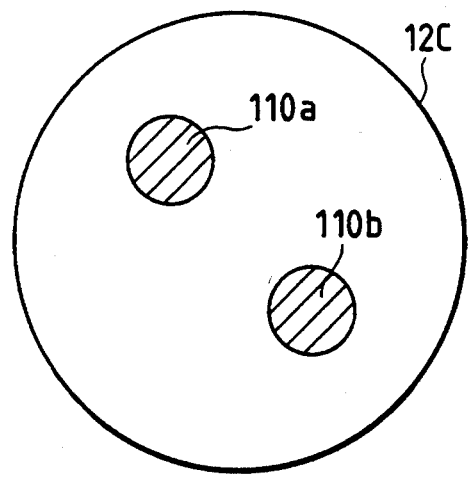
FIGS. 9B and 9D are views showing areas of light beams, on the Fourier transformation plane of the reticle, optimum for illuminating the patterns shown in FIGS. 9A and 9C.

For example, for a pattern 17a, shown in FIG. 9A, having the periodicity in a direction inclined by 45° to the X- and Y-directions, the preferred positions of the fly's eye lenses (or of the secondary light source images) are 110a and 110b shown in FIG. 9B. The coordinate system in these drawings is taken same as in FIGS. 8A to 8D.

Figure 9C:
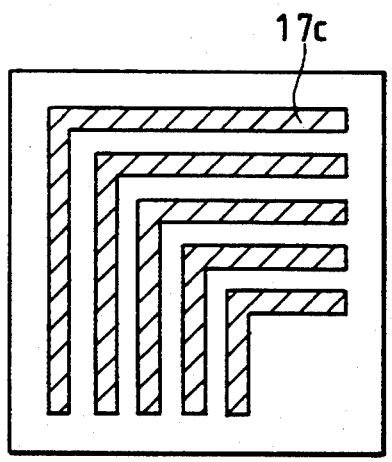
Figure 9D:
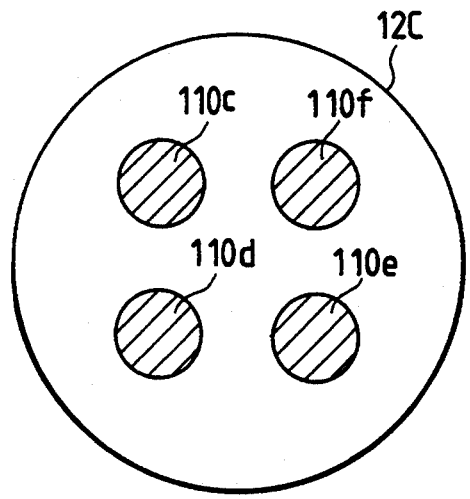

On the other hand, for a pattern 17c as shown in FIG. 9C and having two-dimensional periodicity in the X- and Y-directions, there are preferred four areas 110c, d, e and f shown in FIG. 9D. This four areas 110c, d, e and f are positioned in same manner as shown in FIG. 8D.

Figure 10A:
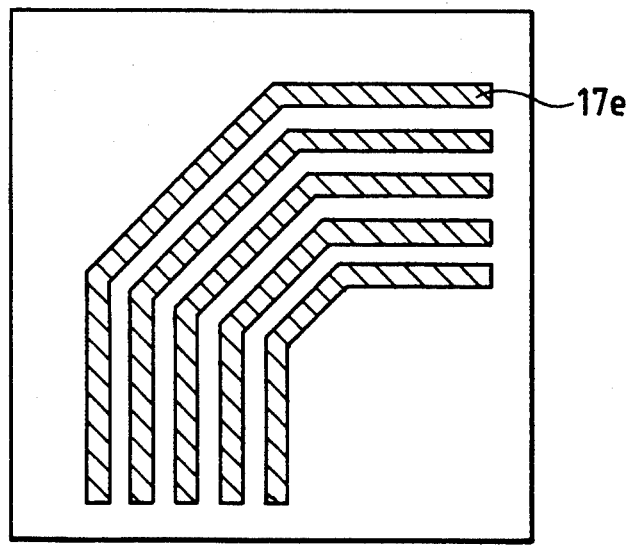
FIG. 10A is a view showing another example of reticle pattern to be employed in the projection exposure apparatus embodying the present invention.
Figure 10A:

Also there is considered a pattern 17e shown in FIG. 10A, which can be considered as a combination of the patterns shown in FIGS. 9A and 9C. For the pattern portions along the X- and Y-directions, optimum are the light beams from four areas shown in FIG. 9D. On the other hand, for the pattern portion inclined to the X- and Y-directions, effective are only the light beams from the areas 110c and 110e in FIG. 9D (equivalent to the areas 110a and 110b in FIG. 9B), and the light beams from the areas 110d and 110f are rather detrimental. Consequently, for the pattern as shown in FIG. 10A, the detrimental effect of the areas 110i, 110j shown in FIG. 10B can be reduced, by increasing the light beam intensity from areas 110g and 110h and reducing the intensity from areas 110i, 110j. Since the areas 110g and 110h, and those 110i and 110j, are symmetrical with respect to the Optical axis AX, the center of gravity of light amounts is displaced from the optical axis as long as these paired areas are same in the light beam intensity, so that the telecentric displacement does not occur. The intensity ratio of these areas can be determined in consideration of the ratio of patterns of different directions in the reticle, and can be regulated by the filters 10a–10d. In such case the transmittance of said filters is conveniently selected at 50% or lower. However the transmittance or number of said filters can be suitably selected according to the pattern to be used.

In case the direction of periodicity of the reticle pattern is taken in consideration as explained above, the above-mentioned information and the intensity ratio of the light beams from the secondary light source image can be entered from a keyboard 52 shown in FIG. 3. In the information of the direction of the pattern or minimum pitch size is entered, the corresponding positions of the fly's eye lenses and the intensity ratio of the light beams can be determined by the main control system 50.

The numerical aperture of the light beam coming from each fly's eye lens to the reticle is preferably in a range of about 0.1 to 0.3 in $\sigma$ value, since an excessively small $\sigma$ value tends to result in a loss or an unevenness in the illumination intensity, while an excessively large value reduces the effect of high resolving power and large depth of focus of the present invention.

In the following there will be explained another embodiment of the present invention, with reference to FIGS. 11 and 12. The exposure apparatus shown in FIG. 11 is same, in basic configuration, as that shown in FIG. 3, but is different therefrom in that the light absorbing (attenuating) filters 10a–10d at the entrance side of the fly's eye lenses 11A–11D are dispensed with, and that the polygonal prism 5, serving as the light beam splitting member, in rendered two-dimensionally movable in a plane perpendicular to the optical axis AX.

Figure 11:
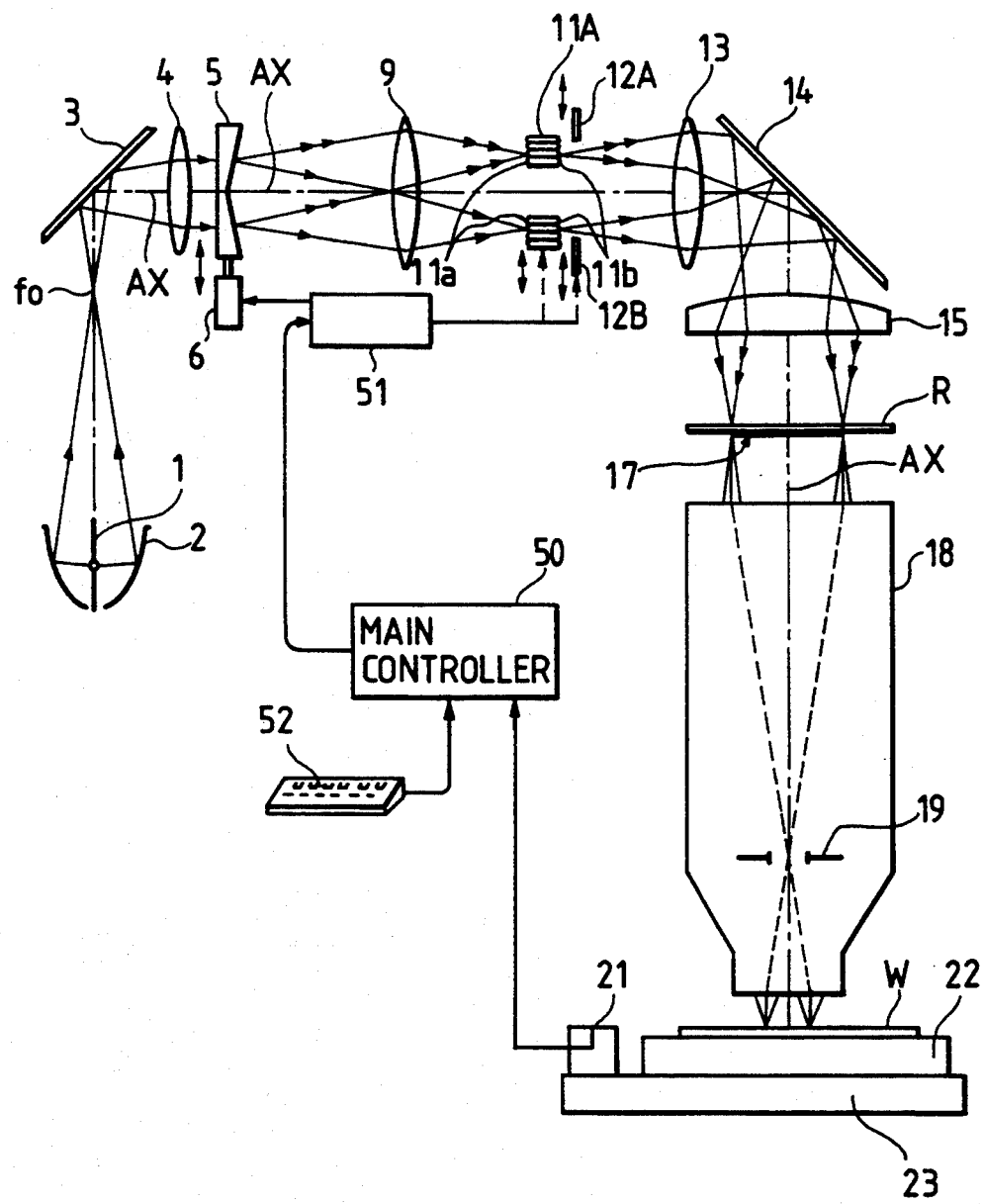
FIG. 11 is a schematic view showing the configuration of another embodiment of the projection exposure apparatus of the present invention.

Referring to FIG. 11, the polygonal prism 5 is supported by an actuating member 6, and is rendered movable in two dimentional direction substantially perpendicular to the optical axis AX. Such movement of the polygonal prism 5 in the direction substantially perpendicular to the optical axis AX varies the splitting position of the light beam entering the polygonal prism 5 (relative position between the polygonal prism 5 and the incident beam), whereby the light amount ratio of the plural light beams after splitting can be varied without loss of the light amount. Said actuating member 6 is controlled by the driving system 51. Said driving system 51 also controls the insertion and retraction of the aforementioned light shield plates 12A, 12B into or from the light paths in the vicinity of the exit plane of the fly's eye lenses, and also moves the fly's eye lenses if they are movable.

On the wafer stage 23, there is provided an illumination intensity detector 21, which receives the light collectively from the entire projection field, and of which light-receiving face lines in a plane substantially matching the wafer surface. Said illumination intensity detecter 21 can measure the illuminating light intensity (light amount) in a position substantially conjugate with the image plane on the reticle R. It can therefore measure the intensity of light beam from a fly's eye lens, by leaving the illuminating light beam from one of the fly's eye lenses 11A, 11B and intercepting the light beam from the other, by manipulation of the light shield plates 12A, 12B. The light beam intensity from each fly's eye lens can be known by effecting such measurement for each fly's eye lens. Said intensity measurement is preferably conducted in the absence of the reticle R, but may also be conducted in the presence thereof.

The measured values of the light beams of the different fly's eye lenses are compared in the main control system 50. The relation between the illuminating light intensity and the driving amount of the actuating member 6 is registered in advance as a table in a memory of the main control system 50, which thus sends an instruction to the driving system 51 for driving the actuating member 6 so as to equalize the intensities of the light beams. In this manner the light beams from the fly's eye lenses can be made mutually equal in intensity.

Figure 12:
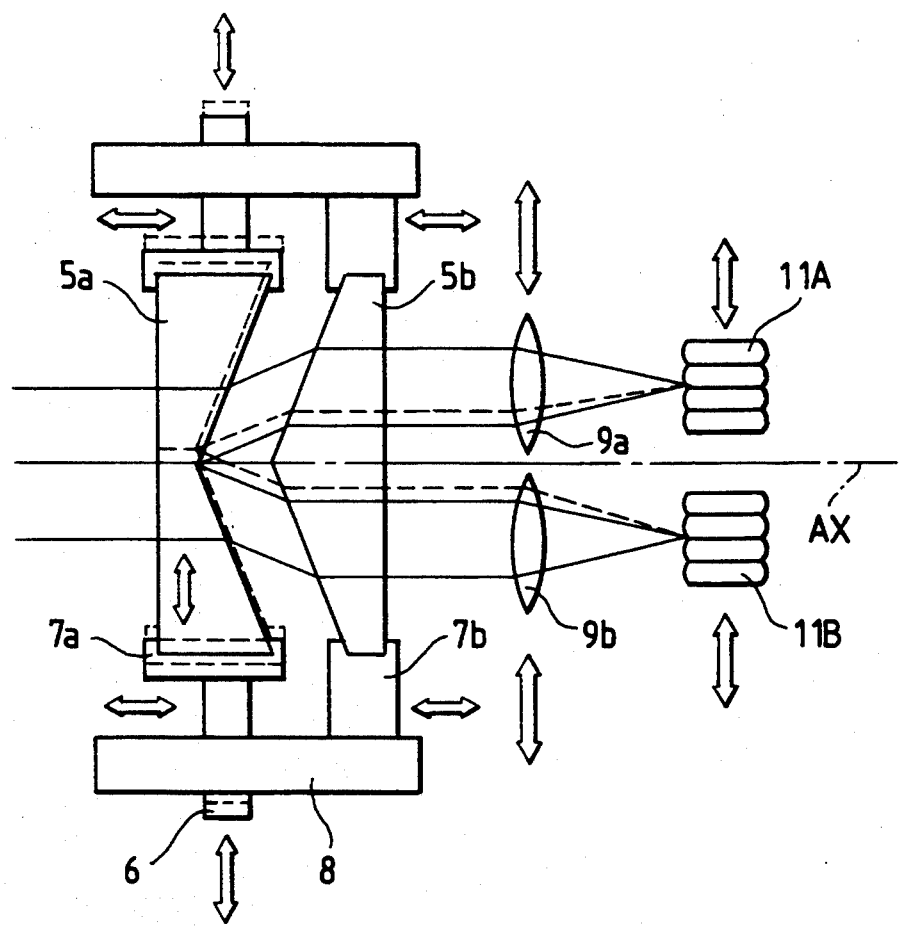
FIG. 12 is a view showing an example of the input optical system (light beam splitting system) to be employed in the apparatus shown in FIG. 11.

Now reference is made to FIG. 12 for explaining the configuration of the polygonal prism 5, to be employed in the apparatus shown in FIG. 11. The polygonal prism 5 is composed of two polygonal prisms 5a, 5b, and, at least the concaveformed prism 5a is movable in a plane perpendicular to the optical axis AX. The prism 5a is supported, by means of a support member 7a, by an actuating member 6, which is fitted in a fixing member 8 and moves the prism 5a in a plane perpendicular to the optical axis AX. On the other hand, the prism 5b is supported, by means of a support member 7b, by the fixing member 8. The prisms 5a, 5b are respectively movable in the direction of the optical axis AX, by a driving unit provided in the fixing member 8, thereby varying the gap of the prisms 5a and 5b along the optical axis AX. In case of bringing the illuminating light beams to a same intensity as explained before, at least the prism 5a is moved by a predetermined amount perpendicularly to the optical axis AX. In case the concave prism 5a is composed of plural optical elements (glass blocks), at least a part of said elements may be rendered movable. In FIG. 12, broken lines indicate a state in which the prism 5a has been moved. If the two light beams are significantly shifted from the optical axis AX in this state, parallel-faced flat glass plates may be provided, respectively in the light paths between the prism 5b and the lenses 9a, 9b, in order to correct the shifts of the light beams away from the optical axis AX.

In case the fly's eye lenses 11A-11D are moved as explained before, the passing positions of the light beams emerging from the polygonal prism have to be varied accordingly. In such case, the distances of the split light beams from the optical axis can be varied by a change in the gap between the prisms 5a and 5b. Also the circumferential positions of the light beams about the optical axis can be varied by the rotation of the prisms 5a, 5b (or fixing member 8) about the optical axis AX.

Also in the configuration shown in FIG. 12, the relay lens 9 between the polygonal prisms 5a, 5b and the fly's eye lenses 11A-lid is separated into relay lenses 9a, 9b. Said relay lenses may therefore be rendered movable in a plane perpendicular to the optical axis AX, according to the movement of the fly's eye lenses 11A-11D. Also said relay lenses may be replaced by a single lens as shown in FIGS. 3 and 11.

The foregoing embodiment employs a mercury lamp 1 as the light source, but there may also be employed another discrete spectrum lamp, a laser (such as KrF laser), or a light source of continuous spectrum. Also the lenses, constituting a major portion of the optical elements in the projection optical system, may be replaced by mirrors (convex or concave). Also the refractive projection optical system may be replaced by a reflective or reflective-refractive system. Also the foregoing embodiments employ a projection optical system which is telecentric on both sides, but there may likewise be employed a system which is telecentric on one side or is non-telecentric. Furthermore, means for obtaining monochromatic light, such as an interference filter, may be provided in the illumination optical system, in order to utilize the light of a specified wavelength, in the illuminating light emitted from the light source.

The illuminating light may be made uniform by a light scattering member, such as a diffusing plate or an optical fiber bundle, provided in the vicinity of the light-source-side focal plane 11a of the fly's eye lenses 11A-11D. In addition to the fly's eye lenses 11A, 11B employed in the foregoing embodiments, there may be employed another optical integrator such as a fly's eye lens (hereinafter called additional fly's eye lens) for obtaining uniform illuminating light. Said additional fly's eye lens is preferably positioned at the light source side of the input optical system for varying the light amount distribution in the vicinity of the light source-side focal plane 11a of the fly's eye lenses 11A, 11B, namely the polygonal prism 5 shown in FIG. 3 or 11. Otherwise there may be provided a group of fly's eye lenses at the reticle side of the fly's eye lenses 11A, 11B. More uniform distribution can be realized, in this manner, by treating each of two illuminating light beams with two fly's eye lenses in two stages.

In the foregoing embodiments, there is employed a pyramidal prism 5 as the light beam splitting member, for four fly's eye lenses 11A-11D, but such configuration is not essential. For example there may be employed a lens array with plural lenses, or a multi-faced mirror, for splitting the light beam. Also in such case, said lens array or multi-faced mirror may be moved along a plane perpendicular to the optical axis AX, for regulating the intensities of the light beams.

Also in the foregoing embodiments, at least a part of the light beam splitting member is rendered movable for varying the light beam splitting position in the illuminating light beam (namely relative position between the illuminating light beam and the light beam splitting member), but it is also possible to vary said splitting position by providing a parallel-faced flat glass plate between the lens system 4 and the light beam splitting member 5 in FIG. 3 or 11 and by varying the inclination of said glass plate.

Furthermore, as disclosed in the U.S. Pat. Nos. 4,465,368 and 4,666,273, a sensor with a pinhole or a two-dimensional CCD sensor may be provided on the stage instead of the illumination intensity detector 21 for measuring the unevenness in the intensity in the image plane, for each of the fly's eye lenses.

Also in the embodiment shown in FIG. 11, if the plural light beams entering the fly's eye lenses 11 involve an intensity difference that cannot be compensated by the aforementioned vertical movement of the prism 5a, light absorbing filters (or meshes) may be provided at the light source side of the fly's eye lenses 11A, 11B as shown in FIG. 3 and may be used in combination with the movement of the prism 5a. As an example, let us consider a case of splitting the illuminating light into four beams by the pyramidal prism 5 and introducing said beams respectively into four fly's eye lenses. In case the centers of said four fly's eye lenses are positioned at the points P$\zeta$, P$\eta$, P$\kappa$ and P$\mu$ shown in FIG. 6D, the prism is so moved that the illuminating lights from the fly's eye lenses at P$\zeta$ and P$\kappa$ become equal in intensity, and correction with the light absorbing filters is so conducted that the illuminating lights from the fly's eye lenses at P$\eta$ and P$\mu$ become equal in intensity.

Figure 10B:
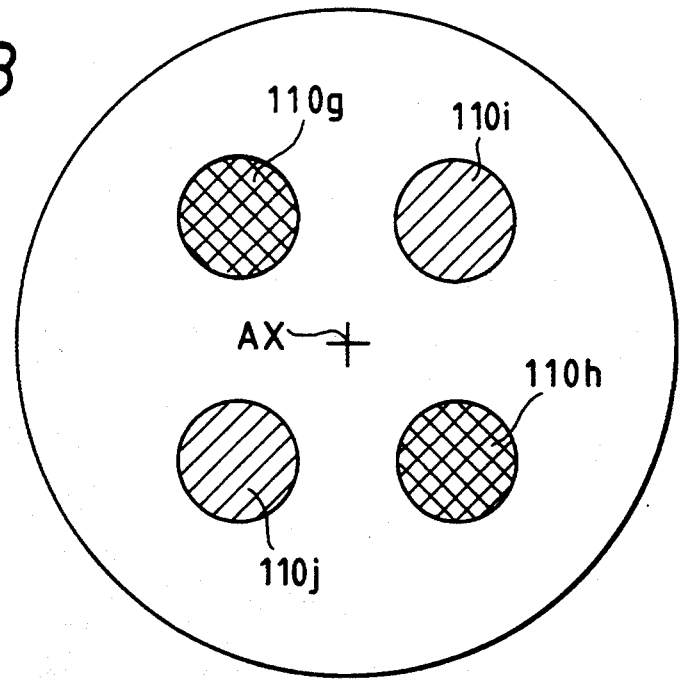
FIG. 10B is a view showing the position of fly's eye lenses, on the Fourier transformation plane of the reticle pattern, optimum for illuminating the pattern shown in FIG. 10A.

Also an example of obtaining different intensities consists of regulating the intensities of the light beams from the areas 110g, 110h, shown in. FIG. 10B, by the vertical movement of the prism 5, and attenuating the light beams from the areas 110i, 110j by the light absorbing filters. If the exposure apparatus of the present embodiment is provided with means for controlling the imaging characteristics of the projection lens (for example pressure control among the lens elements), as disclosed in the U.S. Pat. No. 4,666,273, an error may be generated in said control by a significant change in the ratio of light amounts of the illuminating light beams. In order to avoid such error, a parameter for said control may be varied according to the light amount ratio of the illuminating light beams.

Also in the foregoing embodiments, the illuminating light beams are introduced respectively into separate fly's eye lenses, but it is also possible to introduce the illuminating light beams into a single large fly's eye lens so as to form discrete illuminated areas eccentric from the optical axis AX.

As explained in the foregoing, the present invention allows to realize a projection exposure apparatus with a higher resolving power and a larger depth of focus than in the prior art, while utilizing an ordinary mask. Besides the present invention allows to achieve a higher resolving power, utilizing the projection optical system of the projection exposure apparatus already in operation in the manufacture of semiconductor devices and merely replacing the illuminating system and a part of the main control system.

Also a change in the orientation characteristics or in the position of the light source, eventually resulting from the replacement of lamp or laser in the exposure apparatus can be compensated without loss in the light amounts, whereby realized is a stable exposure apparatus.

Furthermore, optimum imaging performance can be obtained for reticles with patterns of different directionality, by a change in the intensities of arbitrary ones of plural secondary light source images.

What is claimed is:

1. A projection exposure apparatus provided with an illumination optical system for irradiating a mask bearing a periodic pattern with uniform intensity illuminating light, and a projection optical system for imaging the pattern of said mask onto a photosensitive substrate, comprising:

an optical member for forming plural secondary light source images respectively in discrete positions, which are eccentric from an optical axis of said illuminating optical system or said projection optical system, on a plane in the vicinity of a Fourier transformation plane of said mask pattern or a plane conjugate to said transformation plane, in an optical path of said illuminating optical system;

a light amount varying member for varying a ratio between the light amounts of the illuminating light emerging from said plural secondary light source images; and control means for controlling said light amount varying member according to the periodic direction of said mask pattern.

2. A projection exposure apparatus provided with an illumination optical system for converting illuminating light from a light source into a substantially uniform intensity distribution and irradiating a mask bearing a periodic pattern with said uniform illuminating light, and a projection optical system for imaging the pattern of said mask onto a photosensitive substrate, comprising:

an optical member for forming plural secondary light source images respectively in discrete positions, which are eccentric from an optical axis of said illuminating optical system or said projection optical system corresponding to the periodicity of said mask pattern, on a plane in the vicinity of a Fourier transformation plane of said mask pattern or a plane conjugate to said transformation plane, in an optical path of said illuminating optical system;

light amount varying means for adjusting a ratio between the light amounts of the illuminating light emerging from said plural secondary light source images;

light amount measuring means for individually measuring the light amount of the illuminating light emerging from said plural secondary light source images; and control means for controlling said light amount varying means according to information from said light amount measuring means so as to adjust a ratio between the light amounts corresponding to the periodic direction of said mask pattern.

3. A projection exposure apparatus according to claim 2, wherein said control means is adapted to control said light amount varying means to adjust the ratio of light amounts of the illuminating light from two secondary light source images, positioned substantially symmetrically with respect to the optical axis of said illuminating optical system or said projection optical system, among said plural secondary light source images.

4. A projection exposure apparatus according to claim 2, wherein said optical member includes an optical integrator device which forms four secondary light source imaging areas separated from each other on said Fourier transformation plane; and each center position of said four imaging areas is located with a distance from the optical axis corresponding to the periodicity of said mask pattern.

5. A projection exposure apparatus according to claim 4, wherein said light amount varying means includes an input optical system for introducing the illuminating light from said light source into said optical integrator device and dividing the illuminating light into each of said four imaging areas; and said input optical system adjusts the ratio of said division.

6. A projection exposure apparatus provided with an illumination optical system for converting illuminating light from a light source into a substantially uniform intensity distribution and irradiating a mask bearing a periodic pattern with said uniform illuminating light, and a projection optical system for imaging the pattern of said mask onto a photosensitive substrate, comprising:

a fly's eye lens system for forming a secondary light source image in the vicinity of a Fourier transformation plane of said mask pattern or a plane conjugate with said transformation plane, in an optical path of said illumination optical system;

a light beam splitting member for splitting the illuminating light from said light source and introducing the split illuminating light into said fly's eye lens system in such a manner that a light amount distribution in said Fourier transformation plane or the conjugate plane thereof has greater values in at least two discrete areas which are eccentric from an optical axis of said illumination optical system or said projection optical system; and light amount varying means capable of regulating the light amounts of the split illuminating light entering said fly's eye lens system by adjusting the splitting ratio thereof.

7. A projection exposure apparatus according to claim 6, wherein said light beam splitting member is formed integrally with said light amount varying means, and at least a part of said light beam splitting member is rendered movable in a plane perpendicular to the direction of said optical axis.

8. A projection exposure apparatus provided with an illumination optical system for converting illuminating light from a light source into a substantially uniform intensity distribution and irradiating a mask bearing a periodic pattern with said uniform illuminating light, and a projection optical system for imaging the pattern of said mask onto a photosensitive substrate, comprising:

- a fly's eye lens system for forming a secondary light source image in the vicinity of a Fourier transformation plane of said mask pattern or a plane conjugate with said transformation plane, in an optical path of said illumination optical system;
- a light beam splitting member for splitting the illuminating light from said light source into at least two light beams and introducing the split light beams into said fly's eye lens system in such a manner that a light amount distribution in said Fourier transformation plane or the conjugate plane thereof has greater values in at least two discrete areas which are eccentric from an optical axis of said illumination optical system or said projection optical system,
- light amount adjusting means capable of regulating the light amounts of at least two illuminating light beams entering said fly's eye lens system, by adjusting the splitting ratio of said light beam splitting member;
- light amount measuring means for individually measuring the light amounts of at least two illuminating light beams split by said light beam splitting member; and
- control means for controlling said light amount adjusting means, according to information from said light amount measuring means.

9. A projection exposure apparatus according to claim 8, wherein said fly's eye lens system is composed of plural fly's eye lenses which are mutually separated so as to respectively receive illuminating light beam split by said light beam splitting member.

10. A projection exposure apparatus according to claim 8, wherein said light beam splitting member includes a pyramidal prism for splitting the illuminating light from said light source into four light beams to produce the discrete areas having greater values, respectively.

11. A projection exposure apparatus according to claim 8, wherein said fly's eye lens system is composed of mutually separated four fly's eye lenses, and said light beam splitting member includes a pyramidal prism for splitting the illuminating light from said light source for respective introduction into said four fly's eye lenses.

12. A projection exposure apparatus according to claim 6 or 7, wherein said discrete areas having the greater values, respectively, are disposed symmetrically in relation to the optical axis of said illumination optical system.

13. A projection exposure apparatus according to claim 6 or 12, wherein each of said discrete areas having the greater values, respectively, is defined by partition of said secondary light source image produced by said fly's eye lens system, and said light beam splitting member includes a movable mechanism for moving at least a portion of said light beam splitting member so as to change the position of said discrete areas on said Fourier transformation plane.

14. A projection exposure apparatus according to claim 13, wherein each position of said discrete areas defined by partition of said secondary light source image is determined on the basis of the periodicity and periodic direction of said mask pattern.

15. A projection exposure apparatus according to claim 8, wherein said discrete areas having the greater values, respectively, are disposed symmetrically in relation to the optical axis of said illumination optical system.

16. A projection exposure apparatus according to claim 8, wherein each of said discrete areas having the greater values, respectively, is defined by partition of said secondary light source image produced by said fly's eye lens system, and said light beam splitting member includes a movable mechanism for moving at least a portion of said light beam splitting member so as to change the position of said discrete areas on said Fourier transformation plane.

17. A projection exposure apparatus according to claim 9, wherein said fly's eye lens system includes a movable support member holding said plural fly's eye lenses for moving each of said fly's eye lenses in a plane perpendicular to the optical axis of said illumination optical system, and said light beam splitting member includes a movable mechanism for moving at least a portion of said light beam splitting member so as to change the positional relation between said split illuminating light beams according to the position of said plural fly's eye lenses moved by said movable support member.

18. A projection exposure apparatus according to claim 16 or 17, wherein each position of said discrete areas having the greater values, respectively, is determined on the basis of the periodicity and periodic direction of said mask pattern.

19. A projection exposure apparatus according to claim 8, wherein said illumination optical system includes a selecting member to permit the illuminating light emitted from one of said discrete areas to irradiate said mask.

20. A projection exposure apparatus according to claim 19, wherein said light amount measuring means includes a photo detector locating in a plane substantially equivalent to the pattern imaging plane of said projection optical system.

21. A projection exposure apparatus according to claim 8, wherein said light amount adjusting means includes a light attenuating member as to aid in adjusting light amount of each of split illumination light beams.

22. A projection exposure apparatus for printing several periodic patterns of a mask onto a sensitive plate through a projection optical system by illuminating the mask with uniform intensity radiation, the apparatus comprising:

(a) a first optical system for forming a Fourier transformation plane intersecting an optical axis and substantially conjugate with a pupil plane of said projection optical system;

(b) a second optical system for producing four radiation concentrated areas separated from each other in said Fourier transformation plane, wherein each of the concentrated areas emits the radiation supplied to the mask through said first optical system and is disposed eccentrically from the optical axis corresponding to the periodic direction of said mask patterns; and (c) a third optical system for adjusting a distribution ratio between the radiation amounts emitted from each of said four radiation concentrated areas in such manner that the emitted radiation amounts of a first pair of said radiation concentrated areas disposed symmetrically about the optical axis are different from the emitted radiation amounts of a second pair of said radiation concentrated areas disposed symmetrically about the optical axis.

23. A projection exposure apparatus for exposing a periodic pattern image of a first object onto a second object through a projection optical system, comprising:
   (a) a source for irradiating said first object with ultraviolet light;
   (b) a first optical system for forming a Fourier transformation plane intersecting an optical axis and substantially conjugate with a pupil plane of said projection optical system;
   (c) a second optical system for producing plural secondary light source imaging areas separated from each other in said Fourier transformation plane, wherein each of said imaging areas releases the ultraviolet light supplied from said source to the first object through said first optical system and is disposed eccentrically from the optical axis corresponding to the periodic degree of said pattern; and
   (d) a third optical system for adjusting a distribution ratio between the light amounts released from each of said imaging areas corresponding to the periodic direction of said pattern.

24. A projection exposure apparatus according to claim 23, wherein said third optical system includes a light splitting member for dividing the ultraviolet light supplied from said source to plural light beams producing each of said imaging areas.

25. A projection exposure apparatus according to claim 24, wherein said light splitting member includes at least one movable optical element for changing said distribution ratio between the light amounts released from each of said imaging areas.

26. A projection exposure apparatus according to claim 25, wherein said movable optical element is adjusted so that each of the light amounts released from said imaging areas is different corresponding to the periodic direction of said pattern.

27. A projection exposure apparatus according to claim 23, wherein said periodic pattern image of the first object includes plural pattern portions having different periodic directions, respectively, and said third optical system adjusts the distribution ratio between the light amounts released from each of said imaging areas so that said distribution ratio is determined in consideration of a ratio of the plural pattern portions of the different periodic directions.

28. A projection exposure apparatus for printing a periodic pattern of a mask onto a photosensitive substrate through a projection optical system by illuminating the mask with uniform intensity radiation, the apparatus comprising:
   (a) a first optical system for forming a Fourier transformation plane intersecting an optical axis and substantially conjugate with a pupil plane of said projection optical system;
   (b) a second optical system for producing a plurality of radiation concentrated areas separated from each other in said Fourier transformation plane, wherein each of the radiation concentrated areas releases the radiation supplied to the mask through said first optical system and is disposed eccentrically from the optical axis corresponding to the periodic degree of said mask pattern; and
   (c) a third optical system for adjusting a distribution ratio between the radiation amounts released from each of said radiation concentrated areas corresponding to the periodic direction of said mask pattern.

29. A projection exposure apparatus according to claim 28, wherein said periodic pattern of the mask includes plural pattern portions having different periodic directions, respectively, and said third optical system includes a radiation dividing member for adjusting said distribution ratio between the radiation amounts released from each of said radiation concentrated areas so that said distribution ratio is determined in consideration of a ratio of the pattern portions of the different periodic directions in the mask.

30. A projection exposure apparatus according to claim 28, said apparatus further comprising a controlling device to control an imaging characteristic of said projection optical system in response to a predetermined control parameter which is varied according to the adjustment of said distribution ratio.

31. A projection exposure apparatus for printing a periodic pattern of a mask illuminated by uniform intensity light onto a photosensitive substrate supported by a stage through a projection optical system, comprising:
   (a) a beam form shaping device for regulating the external form and size of a light beam;
   (b) a beam splitting device for dividing the regulated light beam to four beam portions sectionally and emitting the four beam portions apart from each other;
   (c) four optical integrator units for producing four secondary light source imaging areas apart from each other substantially on a same plane by introducing said four beam portions to said integrator units, respectively, the center of gravity of said four imaging areas being positioned in a rectangular arrangement;
   (d) a light condensing device disposed between said mask and said four optical integrator units for substantially imaging said four secondary light source imaging areas in a pupil plane of said projection optical system; and
   (e) an adjusting mechanism for changing a dividing ratio for said four beam portions by moving at least a portion of said beam splitting device.

32. A method for producing a semiconductor device through a photolithographic process using a projection exposure apparatus, comprising:
   (a) introducing a mask having a predetermined periodic pattern above a projection optical system of said exposure apparatus;
   (b) providing an illumination system to illuminate said mask with uniform intensity light emitted from plural secondary light source imaging areas separated from each other on a Fourier transformation plane in the illumination system and substantially conjugate with a pupil plane of said projection optical system;
   (c) adjusting the position of each of said plural imaging areas on the Fourier transformation plane corresponding to the periodic degree of said mask pattern;
   (d) changing a light amount ratio between the light emitted from said plural imaging areas corresponding to the periodic direction of said mask pattern; and (e) illuminating said mask with the uniform intensity light and imaging said periodical pattern onto a semiconductor wafer through said projection optical system.

33. A method according to claim 32, wherein said projection exposure apparatus includes means for controlling imaging characteristics of the projection optical system, and further comprising varying a parameter of said means for controlling imaging characteristics according to the light amount ratio changing.

* * * * *